United States Patent
Tailliet et al.

(10) Patent No.: US 12,500,517 B1
(45) Date of Patent: Dec. 16, 2025

(54) I²C BUFFER CIRCUIT WITH FALL TIME CONTROL

(71) Applicant: STMicroelectronics International N.V., Geneva (CH)

(72) Inventors: François Tailliet, Fuveau (FR); Christophe Goncalves, Puyloubier (FR); Marc Battista, Allauch (FR)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/785,413

(22) Filed: Jul. 26, 2024

(51) Int. Cl.
  *H02M 3/07* (2006.01)
  *H03K 17/56* (2006.01)

(52) U.S. Cl.
  CPC ............. *H02M 3/07* (2013.01); *H03K 17/56* (2013.01)

(58) Field of Classification Search
  CPC .................................. H02M 3/07; H03K 17/56
  USPC ........................................................ 327/306
  See application file for complete search history.

(56) References Cited

U.S. PATENT DOCUMENTS

| | | | |
|---|---|---|---|
| 2006/0290381 A1 | 12/2006 | Bui | |
| 2009/0289669 A1 | 11/2009 | Seth | |
| 2010/0264970 A1* | 10/2010 | Anderson | H03K 17/166 327/170 |
| 2021/0249084 A1 | 8/2021 | Yamada | |
| 2022/0278684 A1 | 9/2022 | Shay | |

OTHER PUBLICATIONS

NXP Semiconductors, "UM10204, I2C-bus specification and user manual," Rev. 7.0, Oct. 1, 2021, User Manual, 62 pages.

* cited by examiner

*Primary Examiner* — Tomi Skibinski
(74) *Attorney, Agent, or Firm* — Slater Matsil LLP

(57) ABSTRACT

According to an embodiment, a buffer circuit for a communication interface is disclosed. The circuit includes a charge pump to boost a supply voltage and generate a boosted supply voltage. The circuit features a resistor, a capacitor connected to the output, and multiple transistors. This configuration ensures efficient voltage boosting and buffering for enhanced communication interface performance.

20 Claims, 6 Drawing Sheets

I²C BUFFER CIRCUIT WITH FALL TIME CONTROL

TECHNICAL FIELD

The present disclosure generally relates to electronic circuits and, in particular embodiments, to an I²C buffer circuit with fall time control.

BACKGROUND

Steep transitions on signal lines result in problematic current and voltage surges that impact power supplies and signal lines that can lead to high-frequency harmonics. These occurrences can significantly degrade electromagnetic compatibility, causing noise interference on communication lines and power circuits. Various measures are employed to combat these issues, such as installing decoupling capacitors and carefully routing signal lines.

A scenario where smoother signal transitions play a beneficial role is within the inter-integrated circuit (I²C) communication bus system. According to the I²C standard, there is a requirement for a minimal output fall time on open-drain output signals, which helps to alleviate the aforementioned problems. This requirement ensures that the signals transition smoothly, thus minimizing undesirable electrical effects.

In addition to managing the transitions of signals, it is advantageous that the buffer circuits, which drive these signal lines, possess a high degree of robustness against electrostatic discharges-a common source of damage to electronic components. Consequently, a specific challenge arises: to develop a low-voltage buffer circuit—typical in applications such as the I²C Serial Data (SDA) and serial clock (SCL) lines—that not only achieves a controlled fall time that aligns with the I²C specifications but also demonstrates resilience against electrostatic discharge events.

SUMMARY

Technical advantages are generally achieved by embodiments of this disclosure, which describe an I²C buffer circuit with fall time control.

A first aspect relates to a buffer circuit for a communication interface. The buffer circuit includes a charge pump configured to boost a supply voltage supplied to the buffer circuit and generate a boosted supply voltage at an output terminal of the charge pump; a first resistor; a first capacitor having a first terminal coupled to an output terminal of the buffer circuit; a first p-channel transistor having a source terminal coupled to the supply voltage, a drain terminal of the first p-channel transistor coupled to a first terminal of the first resistor, a gate terminal of the first p-channel transistor coupled to an input of the buffer circuit; a first n-channel transistor having a source terminal coupled to reference ground, a drain terminal of the first n-channel transistor coupled to a second terminal of the first resistor, a gate terminal of the first n-channel transistor coupled to the input of the buffer circuit; a second n-channel transistor having a source terminal coupled to reference ground, a gate terminal of the second n-channel transistor coupled to the second terminal of the first resistor; a third n-channel transistor having a source terminal coupled to the drain terminal of the second n-channel transistor, a drain terminal of the third n-channel transistor coupled to the output terminal of the buffer circuit, a gate terminal of the third n-channel transistor coupled to the output terminal of the charge pump and configured to receive the boosted supply voltage; a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and a fifth n-channel transistor having a gate terminal coupled to its drain terminal and the second terminal of the first resistor, the source terminal of the fifth n-channel transistor coupled to the second terminal of the first capacitor.

A second aspect related to a buffer circuit for a communication interface. The buffer circuit comprising a charge pump configured to boost a supply voltage supplied to the buffer circuit and generate a boosted supply voltage at an output terminal of the charge pump; a reference current source configured to generate a reference current; a mirror p-channel transistor having a gate terminal coupled to the reference current source; a reference p-channel transistor having a source terminal coupled to the supply voltage, a gate terminal of the reference p-channel transistor coupled to its drain terminal and the reference current source; a first capacitor having a first terminal coupled to an output terminal of the buffer circuit; a first p-channel transistor having a source terminal coupled to the supply voltage, a drain terminal of the first p-channel transistor coupled to a source terminal of the mirror p-channel transistor, a gate terminal of the first p-channel transistor coupled to an input of the buffer circuit; a first n-channel transistor having a source terminal coupled to reference ground, a drain terminal of the first n-channel transistor coupled to a drain terminal of the mirror p-channel transistor, a gate terminal of the first n-channel transistor coupled to the input of the buffer circuit; a second n-channel transistor having a source terminal coupled to reference ground, a gate terminal of the second n-channel transistor coupled to the drain terminal of the mirror p-channel transistor; a third n-channel transistor having a source terminal coupled to the drain terminal of the second n-channel transistor, a drain terminal of the third n-channel transistor coupled to the output terminal of the buffer circuit, a gate terminal of the third n-channel transistor coupled to the output terminal of the charge pump and configured to receive the boosted supply voltage; a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and a fifth n-channel transistor having a gate terminal coupled to its drain terminal and the drain terminal of the mirror p-channel transistor, the source terminal of the fifth n-channel transistor coupled to the second terminal of the first capacitor.

A third aspect relates to a communication system. The communication system comprising: a primary controller comprising a first buffer circuit; an auxiliary circuit coupled to the primary controller through a communication bus, the auxiliary circuit comprising a second buffer circuit; wherein the first buffer circuit or the second buffer circuit comprises a charge pump configured to boost a supply voltage supplied to the associated buffer circuit and generate a boosted supply voltage at an output terminal of the charge pump; a first resistor; a first capacitor having a first terminal coupled to an output terminal of the associated buffer circuit; a first p-channel transistor having a source terminal coupled to the supply voltage, a drain terminal of the first p-channel transistor coupled to a first terminal of the first resistor, a gate terminal of the first p-channel transistor coupled to an input of the associated buffer circuit; a first n-channel transistor having a source terminal coupled to reference ground, a drain terminal of the first n-channel transistor coupled to a second terminal of the first resistor, a gate terminal of the first n-channel transistor coupled to the input of the associated buffer circuit; a second n-channel transistor having a source terminal coupled to reference ground, a gate terminal of the second n-channel transistor coupled to the second terminal of the first resistor; a third n-channel transistor having a source terminal coupled to the drain terminal of the second n-channel transistor, a drain terminal of the third n-channel transistor coupled to the output terminal of the associated buffer circuit, a gate terminal of the third n-channel transistor coupled to the output terminal of the charge pump and configured to receive the boosted supply voltage; a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and a fifth n-channel transistor having a gate terminal coupled to its drain terminal and the second terminal of the first resistor, the source terminal of the fifth n-channel transistor coupled to the second terminal of the first capacitor.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
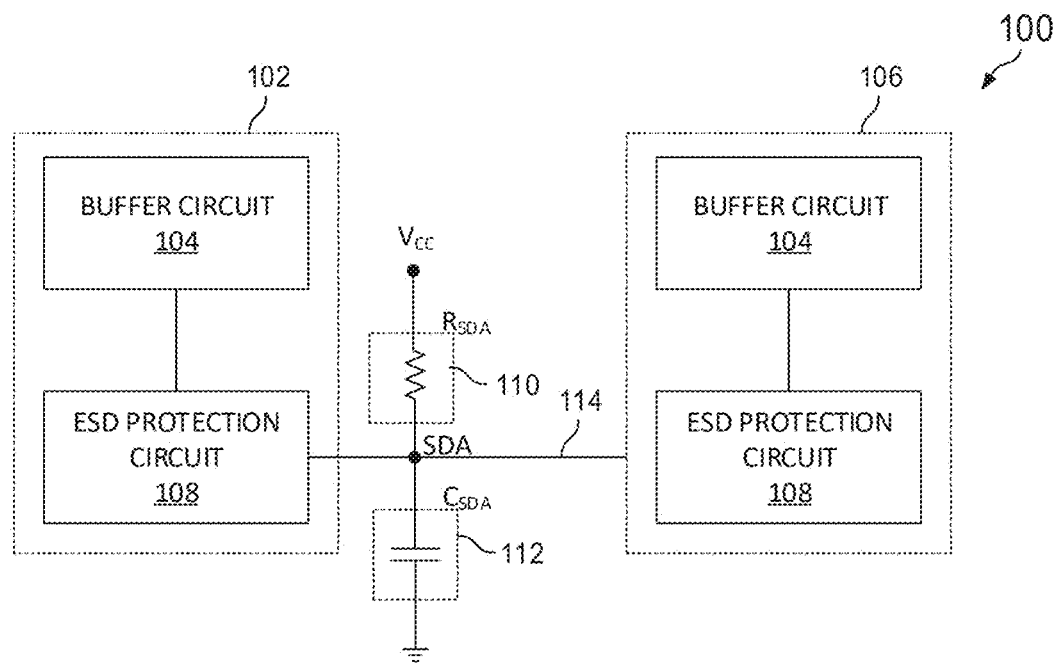
FIG. 1 is a block diagram of an embodiment system incorporating an I²C communication interface.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of an inter-integrated circuit (I²C) communication interface, it should also be appreciated that these inventive aspects may also apply to other types of communication interfaces, and they are non-limiting. Likewise, although the disclosure refers to the serial data (SDA) line of the I²C communication interface in various passages, it should be appreciated that similar functions and circuits may be applied to the serial clock (SCL) line of the I²C communication interface. For example, it is typical for an I²C communication interface to have a primary controller with an output buffer circuit that generates the SCL signal for the SCL line. Such an output buffer circuit's functional and structural features can benefit from the embodiments disclosed herein. Further, aspects of this disclosure may similarly apply to I³C and other serial-type communications.

In embodiments, an I²C buffer circuit with fall time control is proposed. The buffer circuit includes a cascode connection, utilizing a low-voltage transistor as a pull-down element, which is applied to the gate resistive-capacitive (RC) feedback. A high-voltage transistor is incorporated, with its gate voltage maintained at a near-constant level through, for example, a charge pump. An electrostatic discharge (ESD) terminal is shielded from direct exposure to the low-voltage pull-down by the high-voltage transistor, significantly enhancing ESD robustness. The high-voltage transistor is configured to switch off during ESD events, ensuring protection.

In embodiments, integrating the high-voltage transistor in the system permits the voltage on the serial data (SDA) line to surpass 5 volts without incurring damage. The decoupling of the SDA voltage from the supply voltage prevents unwanted back-powering. Utilizing the high-voltage transistor facilitates the inclusion of conventional 5V-compatible ESD protections, such as lateral NPNs, which are compact and effective.

Additional control over the gate terminal of the high-voltage transistor allows for the deactivation of the discharge path leading to the low-voltage transistor. During normal operation, the gate voltage of the high-voltage transistor is kept at a boosted and constant level to maintain zero direct current (DC) consumption from the boost charge pump, which permits repurposing an existing charge pump that services other analog circuits within the system. The RC feedback on the gate voltage applied to the low-voltage manages the conductance of the cascode while simultaneously circumventing any excessive consumption of the boosted voltage.

Embodiments of this disclosure, compared to conventional solutions, advantageously reduce circuit area footprint, power consumption, and proper compliance with high-voltage SDA lines exceeding 2 volts while maintaining controlled fall times on the SDA line in low-voltage applications. These and additional details are detailed below.

FIG. 1 illustrates a block diagram of an embodiment system 100 incorporating an I²C communication interface. System 100 includes a primary (master) controller 102, an auxiliary (slave) circuit 106, an SDA pull-up resistor ($R_{SDA}$) 110, and an SDA bus capacitance ($C_{SDA}$) 112, which may (or may not) be arranged as shown. System 100 may be, for example, a system for an input/output (I/O) expander, a sensor (e.g., temperature sensor, pressure sensor, light sensor, humidity sensor, etc.), or a storage device.

Each of the primary controller 102 and auxiliary circuit 106 includes a buffer circuit 104 and an ESD protection circuit 108, which may (or may not) be arranged as shown. Primary controller 102 and auxiliary circuit 106 may include additional components not shown.

Although FIG. 1 does not include the SCL line and the requisite circuits for the SCL line, it should be appreciated that the description presented is not limited to the SDA line and can be extended to the SCL line. For example, the primary controller 102 and auxiliary circuit 106 can include a dedicated buffer and ESD protection circuit allocated to the SCL line. Likewise, an SCL pull-up resistor and SCL bus capacitor, similar in arrangement to the SDA pull-up resistor ($R_{SDA}$) 11o and the SDA bus capacitance ($C_{SDA}$) 112 of the SDA line, can be included between the primary controller 102 and the auxiliary circuit 106 dedicated to the SCL line.

The I²C interface operates bidirectionally and is managed by the primary controller 102, which initiates communication with the auxiliary circuit 106 through the I²C bus 114. Auxiliary circuit 106 can only transmit data when specifically addressed by the primary controller 102. The auxiliary circuit 106 connected to the I²C bus 114 has a unique address, enabling the primary controller 102 to distinguish among multiple auxiliary circuits.

The I²C physical line includes SCL and SDA lines. These lines operate with an open drain or collector drive system and the buffer circuit 104 for bidirectional communication. The SDA line is coupled to the supply voltage ($V_{CC}$) through the SDA pull-up resistor ($R_{SDA}$) 110—the SCL line would be coupled to the supply voltage ($V_{CC}$) through a SCL pull-up resistor and SCL bus capacitor (not shown). The SDA pull-up resistor ($R_{SDA}$) 110 is selected based on the total capacitance present on the I²C bus 114. Once the SDA pull-up resistor ($R_{SDA}$) 110 value is set, the SDA bus capacitance ($C_{SDA}$) 112 controls the rise and fall time. The primary controller 102 and the auxiliary circuit 106 can drive the I²C bus 114 line to a low state, while the transition to a high state relies on the SDA pull-up resistor ($R_{SDA}$) 110.

A dedicated ESD protection circuit 108 is coupled to the SDA and SCL lines. The ESD protection circuit 108 is configured to safeguard the components coupled to the I²C bus 114 against electrostatic discharges, clamping the voltage to a safe level during an ESD event. ESD protection circuit 108 can protect the I²C system when the ESD event exceeds 4 kV.

The architecture of the I²C bus facilitates expansion, and additional auxiliary circuits can be added by attaching them to the I²C bus 114. Although a single auxiliary circuit 106 is shown in system 100, additional auxiliary circuits may be coupled to the primary controller 102 through the buffer circuit 104.

Rapid signal transitions on an I²C bus 114 may instigate electrical anomalies such as surges, inductive overshoots/undershoots, and unwanted electromagnetic compatibility (EMC) radiation. To prevent such issues and ensure the reliable operation of system 100, the I²C standard stipulates that output signals must not fall too quickly, giving rise to a minimum output fall time requirement.

Specifically, the I²C specification establishes critical timing parameters for signal transitions, including a prescribed "output fall time" parameter. This parameter constrains the rate at which signal voltages can decline, mandating a minimum fall time based on the supply voltage value. For example, the minimum required fall time for a supply voltage of 5.5 volts is 20 nanoseconds. As the supply voltage decreases, the minimum fall time correspondingly shortens, with the I²C specification setting an upper limit of 120 nanoseconds for the fall time.

Fall time is defined within the I²C framework as the duration for the signal voltage to drop from the minimum high-level input voltage ($V_{IH}$) to the maximum low-level input voltage ($V_{IL}$). Hence, the output fall time encompasses the interval from when the voltage crosses below $V_{IH}$ until it passes $V_{IL}$.

Within this context, a challenge involves designing circuitry for a low-voltage system that adheres to the P²C output fall time constraint. Such circuits must operate effectively at very low voltages (e.g., 1 volt), prevent back-powering even when the Serial Data (SDA) line voltage exceeds the power supply level (e.g., greater than 2 volts), and exhibit robustness against ESD—for example, withstanding up to 4 kV as measured by the Human Body Model.

Further, steep transitions on the SDA line must be moderated to protect against current and voltage surges and high-frequency harmonics and enhance electromagnetic compatibility. Accordingly, a buffer circuit that satisfies these specifications and enhances operational reliability and compatibility is desirable.

Figure 2:
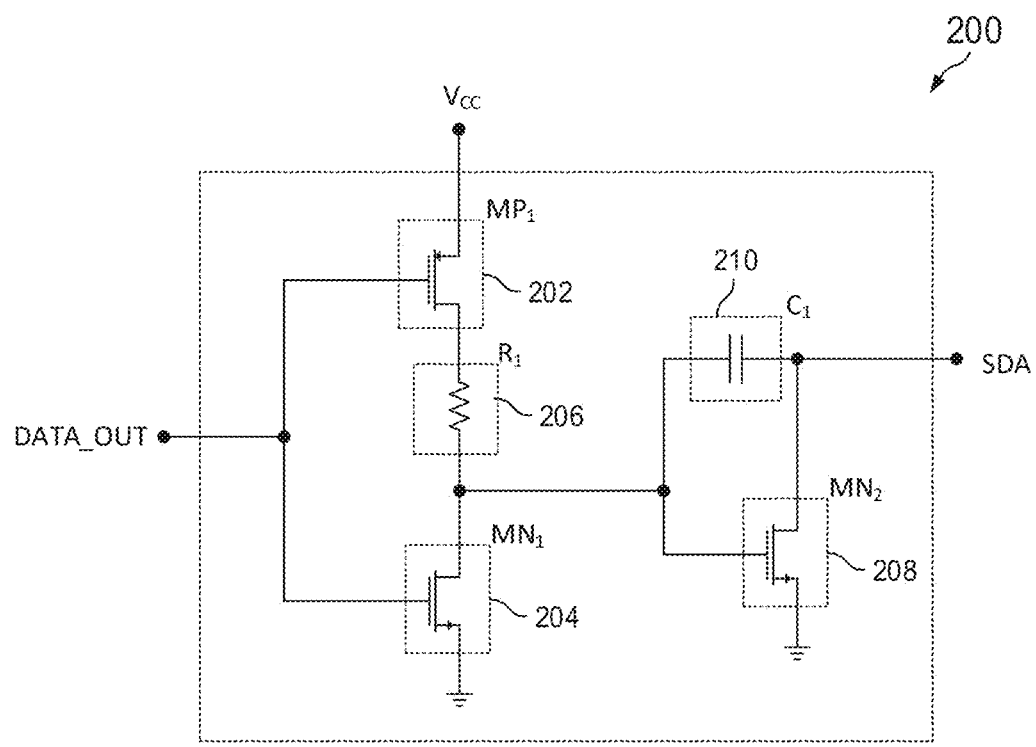
FIG. 2 is a schematic of a buffer circuit, which may be implemented as the buffer circuit of an I²C chip.

FIG. 2 illustrates a schematic of a buffer circuit 200, which may be implemented as the buffer circuit 104 of an P²C chip (i.e., primary controller 102 or auxiliary circuit 106) of system 100. Buffer circuit 200 may be a buffer circuit for the SDA line or the SCL line, although the description provided is limited to the SDA line for brevity.

Buffer circuit 200 includes a first p-channel transistor ($MP_1$) 202, a first n-channel transistor ($MN_1$) 204, a first resistor ($R_1$) 206, a second n-channel transistor ($MN_2$) 208, and a first capacitor ($C_1$) 210.

The gate terminals of the first p-channel transistor ($MP_1$) 202 and the first n-channel transistor ($MN_1$) 204 are coupled to the primary controller 102. A command signal (DATA_OUT), internal to the integrated circuit, is provided to the gate terminals of the first p-channel transistor ($MP_1$) 202 and the first n-channel transistor ($MN_1$) 204. The source terminal of the first p-channel transistor ($MP_1$) 202 is coupled to the supply voltage ($V_{CC}$). The drain terminal of the first p-channel transistor ($MP_1$) 202 is coupled to a first terminal of the first resistor ($R_1$) 206.

The source terminal of the first n-channel transistor ($MN_1$) 204 is coupled to the reference ground. The drain terminal of the first n-channel transistor ($MN_1$) 204 is coupled to a second terminal of the first resistor ($R_1$) 206, the gate terminal of the second n-channel transistor ($MN_2$) 208, and a first terminal of the first capacitor ($C_1$) 210.

The source terminal of the second n-channel transistor ($MN_2$) 208 is coupled to the reference ground. The drain terminal of the second n-channel transistor ($MN_2$) 208 is coupled to a second terminal of the first capacitor ($C_1$) 210, which is coupled to the auxiliary circuit 106 at the SDA node—common node of the SDA pull-up resistor ($R_{SDA}$) 110 and the SDA bus capacitance ($C_{SDA}$) 112.

The first resistor ($R_1$) 206 and the first capacitor ($C_1$) 210 form an RC feedback loop that controls the fall time at the output of the buffer circuit 200. The control signal (DATA_OUT) is a logic signal (e.g., internal to the circuit) that controls the output data for the buffer circuit 200 at the SDA node. In the case of the SCL line, the control signal of the primary controller generates the SCL signal on the SCL line.

When the control signal (DATA_OUT) at the input of buffer circuit 200 is at a high logic level (i.e., '1')—to set the SDA line at high impedance, the first p-channel transistor ($MP_1$) 202 is turned OFF and the first n-channel transistor ($MN_1$) 204 is turned ON. This ON state of the first n-channel transistor ($MN_1$) 204 leads to the discharge at the gate terminal of the second n-channel transistor ($MN_2$) 208 to ground, resulting in it also being turned OFF and set to high impedance. The SDA line is pulled up to the supply voltage ($V_{CC}$) via the SDA pull-up resistor ($R_{SDA}$) 110.

Conversely, if the control signal (DATA_OUT) at the input of buffer circuit 200 is at a low logic level, the first p-channel transistor ($MP_1$) 202 is turned ON and the first n-channel transistor ($MN_1$) 204 is turned OFF. Subsequently, the gate of the second n-channel transistor ($MN_2$) 208 is pulled up to the supply voltage ($V_{CC}$) through the first resistor ($R_1$) 206. However, should there be a rapid decline in the voltage level at the SDA line, the first capacitor ($C_1$) 210 reduces the voltage at the gate terminal of the second n-channel transistor ($MN_2$) 208, reducing its conduction and decelerating the drop in the SDA line.

$I^2C$ systems with a supply voltage ($V_{CC}$) between 1.6V and 5.5V incorporate the second n-channel transistor ($MN_2$) 208 as a high-voltage transistor to allow for controlled SDA fall times and the capacity to sustain 4 kV ESD events. The high-voltage, second n-channel transistor ($MN_2$) 208 has a minimum gate-to-source voltage ($V_{GS}$), referred to as the threshold voltage ($V_TH$) between 0.8V to 1.2V inclusive (e.g., 1V). The threshold voltage ($V_TH$) of the high-voltage, second n-channel transistor ($MN_2$) 208 may reach 1V in slow, low-temperature applications, which is still manageable with the 1.6V power supply.

However, a high-voltage transistor, such as the high-voltage, second n-channel transistor ($MN_2$) 208, is incompatible with low-voltage applications where the supply voltage is less than 1.4V or between 1.1 and 1.3V (e.g., around 1.2V). To activate with a low-voltage supply, the high-voltage, second n-channel transistor ($MN_2$) 208 would require a large transistor area, negatively affecting the capacitance of the $I^2C$ bus 114.

A potential solution to overcome the threshold issue is to replace the high-voltage, second n-channel transistor ($MN_2$) 208 with a low-voltage, second n-channel transistor ($MN_2$) 208 having a threshold voltage ($V_{TH}$) of between 0.4 and 0.6 V inclusive (e.g., 0.5V) with a first gate oxide "Gate Oxide 1" (GO1) layer optimized for standard performance characteristics at a 1.8V supply voltage and rated at a maximum breaking voltage of 1.95V.

However, this fix creates a different challenge; the low-voltage, second n-channel transistor ($MN_2$) 208 cannot handle the high voltage (5V) needed on the SDA line. For example, the low-voltage, second n-channel transistor ($MN_2$) 208 cannot cope with an SDA line that reaches 2.5V or 3V, as its maximum drain voltage rating would be exceeded. Similarly, a low-voltage, second n-channel transistor ($MN_2$) 208 rated at 1.2V cannot be coupled to an $I^2C$ bus 114 that reaches 1.8V due to the maximum breaking voltage rating of the second n-channel transistor ($MN_2$) 208.

Figure 3:
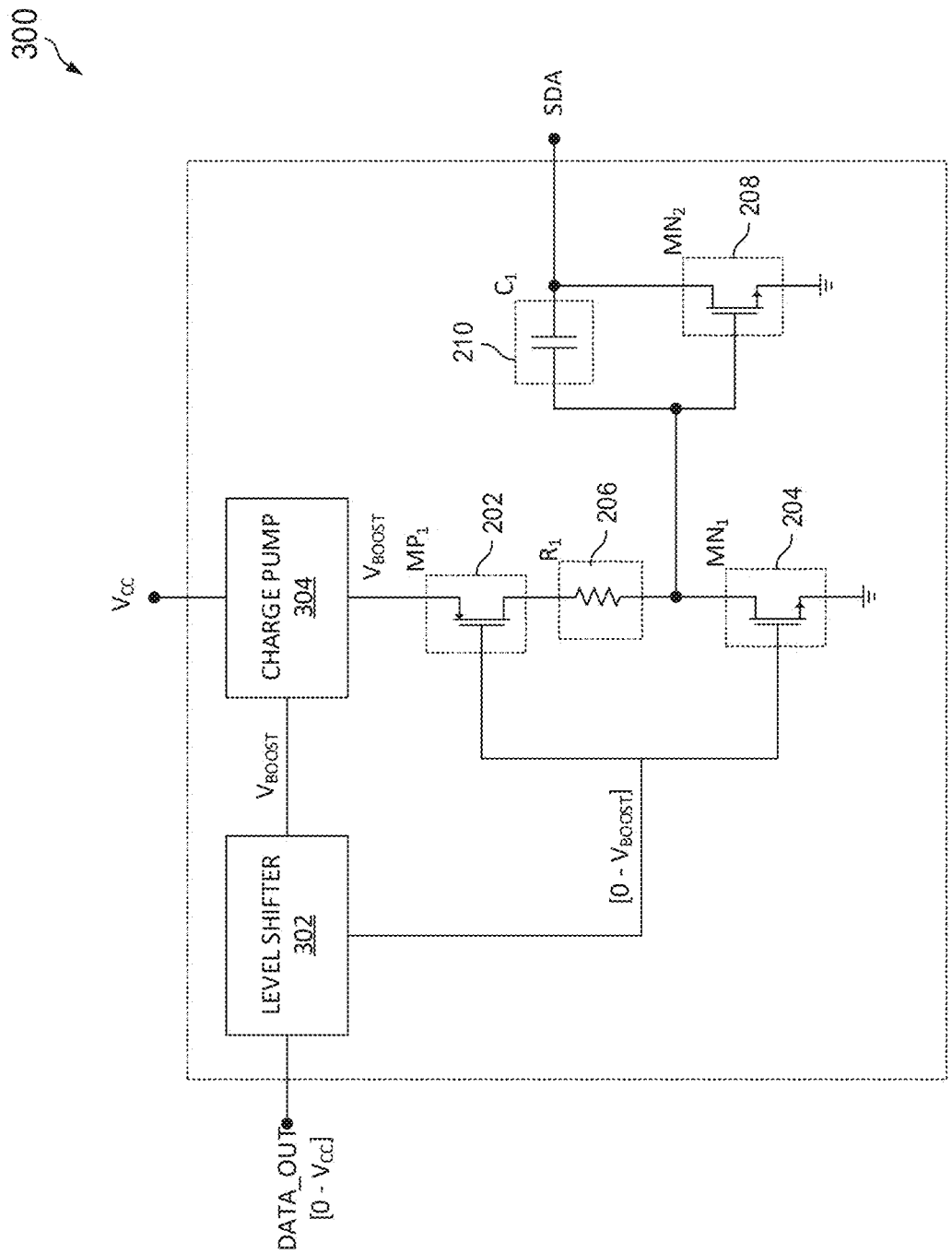
FIG. 3 is a schematic of a buffer circuit, which may be implemented as the buffer circuit of an I²C chip.

FIG. 3 illustrates a schematic of a buffer circuit 300, which may be implemented as the buffer circuit of an $I^2C$ chip. Buffer circuit 300, similar to buffer circuit 200, includes the first p-channel transistor ($MP_1$) 202, the first n-channel transistor ($MN_1$) 204, the first resistor ($R_1$) 206, the second n-channel transistor ($MN_2$) 208, and the first capacitor ($C_1$) 210. In addition, buffer circuit 300 includes a level shifter 302 and a charge pump 304. The second n-channel transistor ($MN_2$) 208 is a high-voltage transistor.

The arrangement of the components of the buffer circuit 300 is similar to that of the buffer circuit 200 but with minor differences. In contrast to the buffer circuit 200, the gate terminals of the first p-channel transistor ($MP_1$) 202 and the first n-channel transistor ($MN_1$) 204 are coupled to the primary controller 102 through the level shifter 302. Further, the source terminal of the first p-channel transistor ($MP_1$) 202 in buffer circuit 300 is coupled to the charge pump 304 instead of the supply voltage ($V_{CC}$).

The charge pump 304 is configured to boost the low-voltage supply voltage ($V_{CC}$) to a boosted supply voltage ($V_{BOOST}$). In embodiments, the low-voltage supply voltage ($V_{CC}$) is set to 1.2V. In embodiments, the boosted supply voltage ($V_{BOOST}$) is greater than 2.5V (e.g., set to 3V).

The level shifter, in return, boosts the range of the input signal to the gate terminals of the first p-channel transistor ($MP_1$) 202 and the first n-channel transistor ($MN_1$) 204, which is between 0 and the supply voltage ($V_{CC}$) in the buffer circuit 200, to be between 0 and the boosted supply voltage ($V_{BOOST}$). The boosted supply voltage ($V_{BOOST}$) at the gate terminal of the second n-channel transistor ($MN_2$) 208 addresses the threshold and ESD issues.

Nonetheless, the periodic charge and discharge of the second n-channel transistor ($MN_2$) 208 during buffer switching and the feedback loop, through the first resistor ($R_1$) 206 and the first capacitor ($C_1$) 210, which pulls down the gate terminal of the second n-channel transistor ($MN_2$) 208 to control the fall time, creates periodic current surges on the boosted supply voltage ($V_{BOOST}$). The periodic current surges generate noise and prevent the charge pump 304 from being used in other circuits that require a stable and noise-free boosted supply voltage ($V_{BOOST}$), such as the EEPROM read circuitry.

Figure 4:
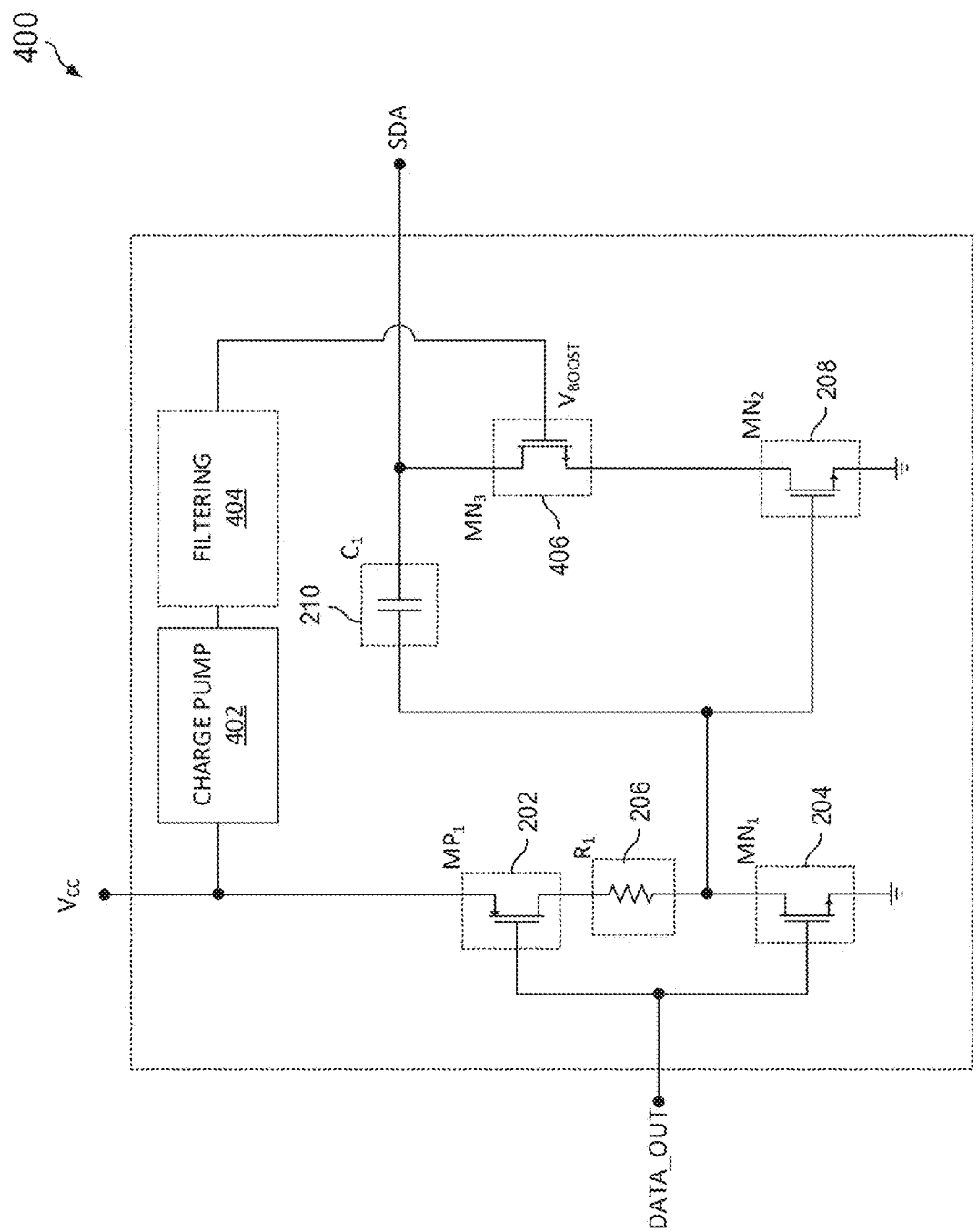
FIG. 4 is a schematic of an embodiment buffer circuit, which may be implemented as the buffer circuit of an I²C chip.

FIG. 4 illustrates a schematic of an embodiment buffer circuit 400, which may be implemented as the buffer circuit of an $I^2C$ chip. Buffer circuit 400 includes the first p-channel transistor ($MP_1$) 202, the first n-channel transistor ($MN_1$) 204, the first resistor ($R_1$) 206, the second n-channel transistor ($MN_2$) 208, the first capacitor ($C_1$) 210, a charge pump 402, an optional filtering circuit 404, and a third n-channel transistor ($MN_3$) 406, which may (or may not) be arranged as shown.

The first p-channel transistor ($MP_1$) 202, the first n-channel transistor ($MN_1$) 204, and the second n-channel transistor ($MN_2$) 208 are low-voltage transistors (i.e., threshold voltage ($V_{TH}$) between 0.4 and 0.6V inclusive (e.g., 0.5V) with a first gate oxide "Gate Oxide 1" (GO1) layer optimized for standard performance characteristics at a 1.8V supply voltage).

The third n-channel transistor ($MN_3$) 406 is a high-voltage transistor (i.e., it has a threshold voltage ($V_TH$) between 0.8V to 1.2V inclusive (e.g., 1V) and a maximum rated operating voltage greater than 12V).

The third n-channel transistor ($MN_3$) 406 is configured as a cascode to the second n-channel transistor ($MN_2$) 208. Specifically, the drain terminal of the third n-channel transistor ($MN_3$) 406 is coupled to the second terminal of the first capacitor ($C_1$) 210. The gate terminal of the third n-channel transistor ($MN_3$) 406 is coupled to the output of the charge pump 402, which receives the boosted supply voltage ($V_{BOOST}$). The source terminal of the third n-channel transistor ($MN_3$) 406 is coupled to the drain terminal of the second n-channel transistor ($MN_2$) 208. Accordingly, during an ESD event, the second n-channel transistor ($MN_2$) 208 is protected by the third n-channel transistor ($MN_3$) 406.

The second n-channel transistor ($MN_2$) 208 and the third n-channel transistor ($MN_3$) 406 actively drive the SDA line low.

The voltage on the SDA line can exceed 5V. For example, if the voltage at the output of the buffer circuit 400 (i.e., at the drain terminal of the third n-channel transistor ($MN_3$) 406) is at 5V, the voltage at the gate terminal of the third n-channel transistor ($MN_3$) 406 is at a boosted supply voltage ($V_{BOOST}$) of 3V, and the threshold voltage ($V_{TH}$) of the third n-channel transistor (MN$_3$) 406 is between 0.8V to 1.2V inclusive (e.g., 1V), the voltage at the source terminal of the third n-channel transistor (MN$_3$) 406 (and in turn the voltage at the drain terminal of the second n-channel transistor (MN$_2$) 208) will not exceed 2V.

The high conduction level of the third n-channel transistor (MN$_3$) 406 is achieved by boosting the voltage at its gate terminal, which is effective even with the transistor's high-voltage characteristic.

The second n-channel transistor (MN$_2$) 208 also exhibits high conductivity, attributed to it being a low-voltage transistor. There is no requirement for a large width-to-length (W/L) ratio for the second n-channel transistor (MN$_2$) 208 or the third n-channel transistor (MN$_3$) 406 to satisfy the low-level output current ($I_{OL}$) and output voltage ($V_{OL}$) specifications.

The fall time is regulated by the first resistor (R) 206 and the first capacitor (C$_1$) 210 coupled to the gate terminal of the second n-channel transistor (MN$_2$) 208. The first resistor (R$_1$) 206 and the first capacitor (C$_1$) 210 arrangement do not contribute to the current draw on the boosted supply voltage ($V_{BOOST}$), ensuring a near zero power consumption from the boosted supply voltage ($V_{BOOST}$) due to this configuration. Generally, during a falling transition of the SDA line, the gate-to-channel capacitance and Miller capacitances of the third n-channel transistor (MN$_3$) 406 still draw some alternating current (AC) on the boosted supply voltage ($V_{BOOST}$). However, this current is significantly smaller than the current flowing into the first capacitor (C$_1$) 210. This is because the total capacitances experienced by the gate terminal of the third n-channel transistor (MN$_3$) 406 are much smaller than that of the first capacitor (C$_1$) 210.

Additionally, no energy is used from the boosted supply voltage ($V_{BOOST}$) during the gating action of the second n-channel transistor (MN$_2$) 208, which involves the first n-channel transistor (MN$_1$) 204 and the first p-channel transistor (MP$_1$) 202.

Any potential noise on the boosted supply voltage ($V_{BOOST}$) is primarily due to the capacitive coupling (e.g., Miller capacitance, gate-channel capacitance, etc.) at the gate-to-drain and gate-to-source channels of the third n-channel transistor (MN$_3$) 406. However, this minimally induced noise can be effectively filtered through optional filtering circuit 404.

In contrast to the buffer circuit 300, the circuit arrangement and, in particular, the third n-channel transistor (MN$_3$) 406 prevents the power consumption of the RC feedback loop on the boosted supply voltage ($V_{BOOST}$). Accordingly, the charge pump 402, which provides the boosted supply voltage ($V_{BOOST}$), is versatile and can be utilized for other analog voltage-boosting applications within the system without introducing significant noise issues.

Thus, the third n-channel transistor (MN$_3$) 406 and the second n-channel transistor (MN$_2$) 208 ensure robust pulling down of the SDA line with effective conduction and without necessitating a significant area or power overhead while also maintaining precise control over signal timings through simple passive components.

In embodiments, buffer circuit 400 includes the filtering circuit 404. The charge pump 402 can include switch capacitors, resulting in ripples. The ripple amplitude can be, for example, 100 mV. Accordingly, the boosted supply voltage ($V_{BOOST}$) has a corresponding ripple of a few hundred millivolts due to the gate-to-channel capacitance of the third n-channel transistor (MN$_3$) 406, resulting in ripples on the SDA line at the output of the buffer circuit 400. Accordingly, by filtering the boosted supply voltage ($V_{BOOST}$) at the output of the charge pump 402 through the filtering circuit 404, the ripple and associated noise on the SDA line at the output of the buffer circuit 400 is reduced.

In embodiments, filtering circuit 404 can serve a dual purpose. First, from the SDA line to the charge pump 402, it can prevent noise generated by the switching of the SDA signal from being transmitted to the boosted supply voltage ($V_{BOOST}$) through the parasitic capacitances of the third n-channel transistor (MN$_3$) 406. Secondly, from the charge pump 402 to the SDA line, it can prevent ripples, which are naturally generated by the internal capacitor switching within the charge pump 402, from being transmitted to the SDA line through the parasitic capacitances of the third n-channel transistor (MN$_3$) 406.

Figure 5:
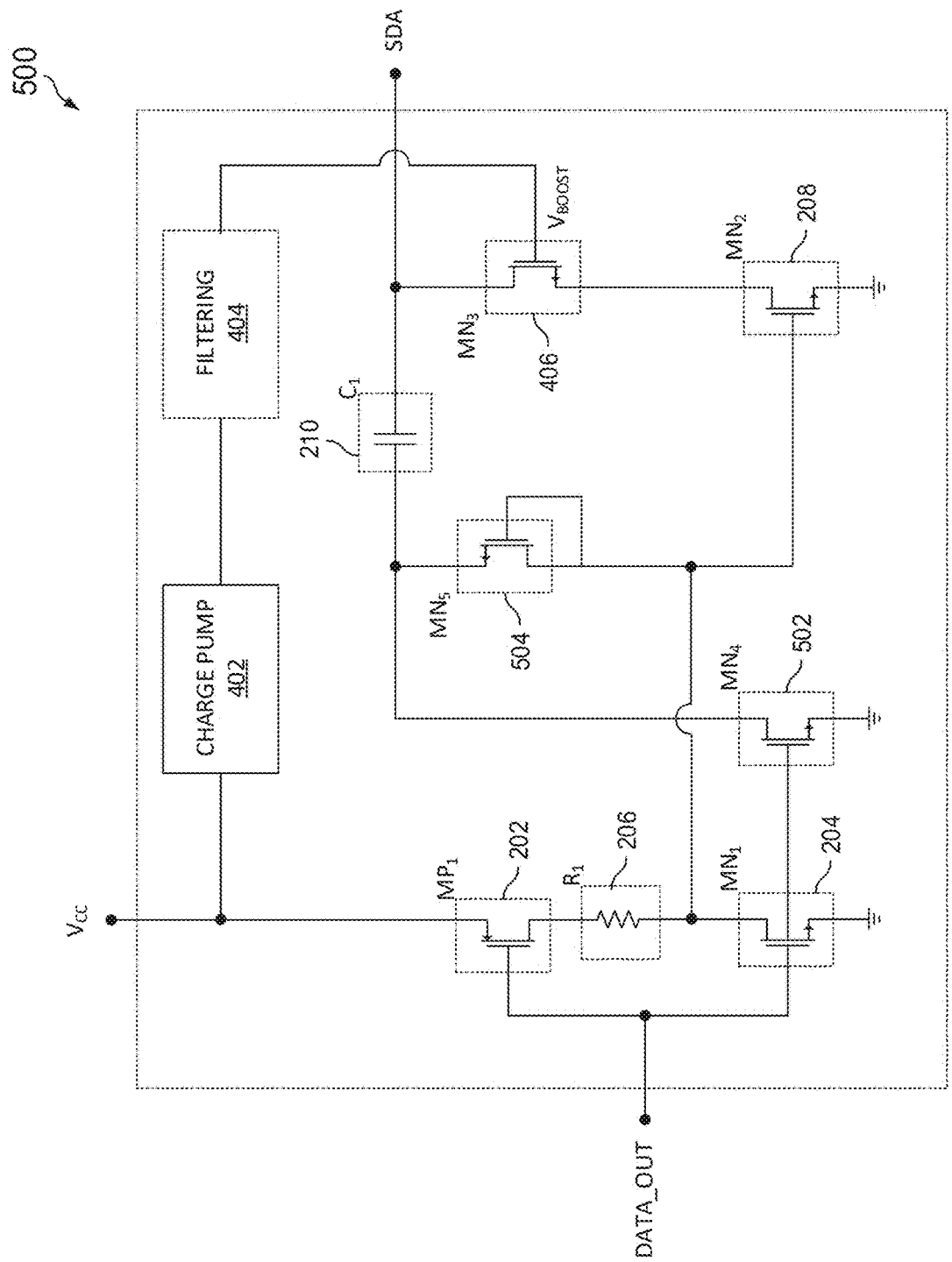
FIG. 5 is a schematic of an embodiment buffer circuit, which may be implemented as the buffer circuit of an I²C chip.

FIG. 5 illustrates a schematic of an embodiment buffer circuit 500, which may be implemented as the buffer circuit 104 of system 100. Buffer circuit 500 includes the first p-channel transistor (MP$_1$) 202, the first n-channel transistor (MN$_1$) 204, the first resistor (R$_1$) 206, the second n-channel transistor (MN$_2$) 208, the first capacitor (C$_1$) 210, the charge pump 402, the optional filtering circuit 404, the third n-channel transistor (MN$_3$) 406, a fourth n-channel transistor (MN$_4$) 502, and a fifth n-channel transistor (MN$_5$) 504, which may (or may not) be arranged as shown.

The arrangement of the components of buffer circuit 500 is quite similar to that of buffer circuit 400 with some differences. Specifically, buffer circuit 500 includes the fourth n-channel transistor (MN$_4$) 502 and the fifth n-channel transistor (MN$_5$) 504.

The fourth n-channel transistor (MN$_4$) 502 and the fifth n-channel transistor (MN$_5$) 504 are low-voltage transistors (i.e., threshold voltage ($V_TH$) of between 0.4 and 0.6V inclusive (e.g., 0.5V) with a first gate oxide "Gate Oxide 1" (GO1) layer optimized for standard performance characteristics at a 1.8V supply voltage).

Further, the fifth n-channel transistor (MN$_5$) 504 is selected to be identical to the second n-channel transistor (MN$_2$) 208 with a common threshold voltage ($V_{TH\_N}$).

The gate terminal of the fourth n-channel transistor (MN$_4$) 502 is coupled to the gate terminal of the first n-channel transistor (MN$_1$) 204. The source terminal of the fourth n-channel transistor (MN$_4$) 502 is coupled to the reference ground. The drain terminal of the fourth n-channel transistor (MN$_4$) 502 is coupled to the first terminal of the first capacitor (C$_1$) 210 and the source terminal of the fifth n-channel transistor (MN$_5$) 504.

The gate terminal of the fifth n-channel transistor (MN$_5$) 504 is coupled to its drain terminal (i.e., diode-connected), which itself is coupled to the second terminal of the first resistor (R$_1$) 206 and the gate terminal of the second n-channel transistor (MN$_2$) 208. Due to its diode-connected configuration, the fifth n-channel transistor (MN$_5$) 504 acts as a diode.

Without the fifth n-channel transistor (MN$_5$) 504 in buffer circuit 500, the first capacitor (C$_1$) 210 slows down the switching time of the second n-channel transistor (MN$_2$) 208 when the input signal on the SDA line at the input of the buffer circuit 104 switches, for example, from a high logic level to a low logic level.

Advantageously, when increasing the gate voltage at the common node between the second terminal of the first resistor (R$_1$) 206, the drain terminal of the first n-channel transistor (MN$_1$) 204, and the gate terminal of the second n-channel transistor (MN$_2$) 208, the fifth n-channel transistor (MN$_5$) 504 prevents current to flow from the first capacitor (C$_1$) 210 until the voltage at the gate terminal of the second n-channel transistor ($MN_2$) 208 reaches the threshold voltage ($V_{TH\_N}$). By blocking the current from the first capacitor ($C_1$) 210, the slowing down of the switching time of the second n-channel transistor ($MN_2$) 208 is prevented.

The fourth n-channel transistor ($MN_4$) 502, similar to the first n-channel transistor ($MN_1$) 204, discharges the voltage at the gate terminal of the second n-channel transistor ($MN_2$) 208 when the output of the buffer circuit 500 is at a high logic level.

It is noted that the first n-channel transistor ($MN_1$) 204 is prevented from performing its function in buffer circuit 500 (and buffer circuit 600) due to the addition of the fifth n-channel transistor ($MN_5$) 504 in series with the first n-channel transistor ($MN_1$) 204. Accordingly, the fourth n-channel transistor ($MN_4$) 502 is added to buffer circuit 500 (in addition to buffer circuit 600) to perform the action previously carried out by the first n-channel transistor ($MN_1$) 204 in buffer circuit 400.

Further, the fourth n-channel transistor ($MN_4$) 502, before setting a low logic level at the output of the buffer circuit 500, initializes the first capacitor ($C_1$) 210 (i.e., sets an initial discharge condition) to have a voltage equal to the supply voltage ($V_{CC}$) at the second terminal (i.e., at the SDA line) of the first capacitor ($C_1$) 210 and zero voltage at the first terminal (i.e., at the drain terminal of the fourth n-channel transistor ($MN_4$) 502) of the first capacitor ($C_1$) 210. The initialization (i.e., charging at the beginning of the fall at the SDA line) of the first capacitor ($C_1$) 210 allows for fall time control and the proper operation of the RC feedback loop through the first resistor ($R_1$) 206 and the first capacitor ($C_1$) 210.

When the input data is at a low logic level, the first p-channel transistor ($MP_1$) 202 is turned ON and the first n-channel transistor ($MN_1$) 204 and the fourth n-channel transistor ($MN_4$) 502 are turned OFF. The voltage at the common node between the gate terminal of the second n-channel transistor ($MN_2$) 208 and the fifth n-channel transistor ($MN_5$) 504 quickly rises to the threshold voltage ($V_{TH\_N}$) without injecting current into the first capacitor ($C_1$) 210. This prevents the RC feedback (through the first resistor (R) 206 and the first capacitor ($C_1$) 210) from delaying the start of conduction at the second n-channel transistor ($MN_2$) 208—the delay would degrade the I²C data access time.

When the input data is at a high logic level, the first p-channel transistor ($MP_1$ 202 is turned OFF and the first n-channel transistor ($MN_1$) 204 and the fourth n-channel transistor ($MN_4$) 502 are turned ON. This ON state of the first n-channel transistor ($MN_1$) 204 and the fourth n-channel transistor ($MN_4$) 502 leads to the discharge at the gate terminal of the second n-channel transistor ($MN_2$) 208 to ground, resulting in it also being turned OFF. The fifth n-channel transistor ($MN_5$) 504 prevents the first capacitor ($C_1$) 210 from rising to the voltage at the gate terminal of the second n-channel transistor ($MN_2$) 208 during rising edges of the SDA line-preventing the turn ON of the second n-channel transistor ($MN_2$) 208 and preventing the delaying of the rise of the signal at the SDA line.

Figure 6:
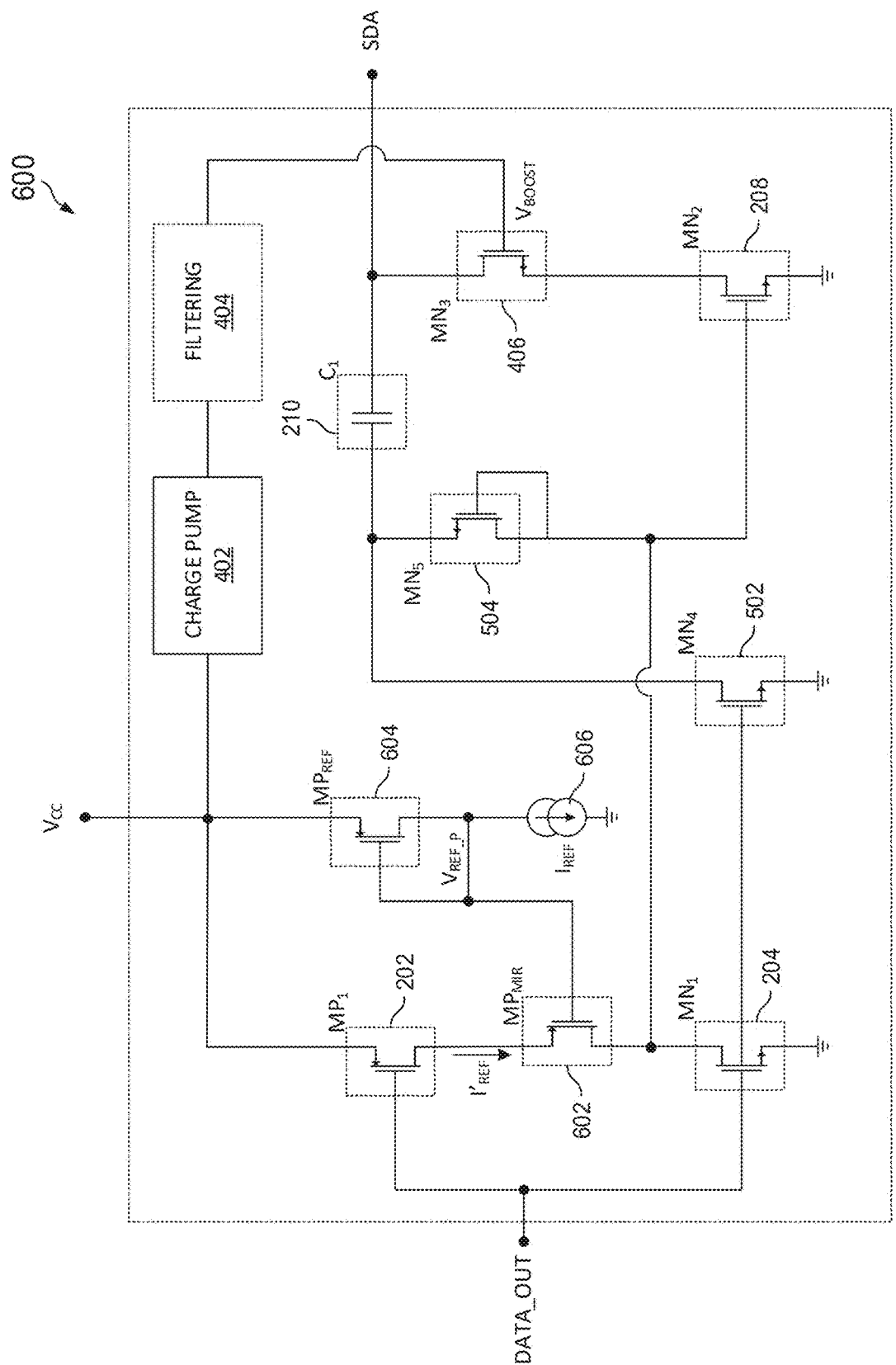
FIG. 6 is a schematic of an embodiment buffer circuit, which may be implemented as the buffer circuit of an I²C chip.

FIG. 6 illustrates a schematic of an embodiment buffer circuit 600, which may be implemented as the buffer circuit of an I²C chip. Buffer circuit 600 includes the first p-channel transistor ($MP_1$) 202, the first n-channel transistor ($MN_1$) 204, the second n-channel transistor ($MN_2$) 208, the first capacitor ($C_1$) 210, the charge pump 402, the optional filtering circuit 404, the third n-channel transistor ($MN_3$) 406, the fourth n-channel transistor ($MN_4$) 502, the fifth n-channel transistor ($MN_5$) 504, a mirror p-channel transistor ($MP_{MIR}$) 602, a reference transistor ($MP_{REF}$) 604, and a current source ($I_{REF}$) 606, which may (or may not) be arranged as shown.

The drain terminal of the first p-channel transistor ($MP_1$) 202 is coupled to the source terminal of the mirror p-channel transistor ($MP_{MIR}$) 602. The drain terminal of the mirror p-channel transistor ($MP_{MIR}$) 602 is coupled to the drain terminal of the first n-channel transistor ($MN_1$) 204, the gate terminal of the second n-channel transistor ($MN_2$) 208, and the gate and source terminals of the fifth n-channel transistor ($MN_5$) 504. The gate terminal of the mirror p-channel transistor ($MP_{MIR}$) 602 is coupled to the gate and drain terminals of the reference transistor ($MP_{REF}$) 604 and the current source ($I_{REF}$) 606.

In contrast to the buffer circuit 500, which uses the first resistor ($R_1$) 206 to control the fall time, buffer circuit 600 uses the current source ($I_{REF}$) 606 to control the fall time (slope control). Accordingly, the first resistor ($R_1$) 206 in buffer circuit 500 is substituted with the mirror p-channel transistor ($MP_{MIR}$) 602, the reference transistor ($MP_{REF}$) 604, and the current source ($I_{REF}$) 606. The same concept can be extended to the buffer circuit 400.

The current source ($I_{REF}$) 606 generates a reference current ($I_{REF}$). A nearly constant reference current ($I'_{REF}$) flows through the mirror p-channel transistor ($MP_{MIR}$) 602, which mirrors the current flowing through the reference transistor ($MP_{REF}$) 604.

The slope control arrangement of the buffer circuit 500, through the first resistor ($R_1$) 206, provides a fall time that is nearly independent of the supply voltage and controlled by the product of the first resistor ($R_1$) 206 and the first capacitor ($C_1$) 210. The falling slope at the SDA line is steeper at a higher supply voltage and nearly proportional to the supply voltage.

The falling slope (dV/dt) of the SDA line is approximately equal to $I'_{REF}/C_1$, where $C_1$ is the capacitance of the first capacitor ($C_1$) 210. The falling slope of the SDA line in buffer circuit 600 becomes nearly independent of the supply voltage, resulting in the fall time at the SDA line being dependent on the supply voltage and nearly proportional to the supply voltage.

Figure 7:
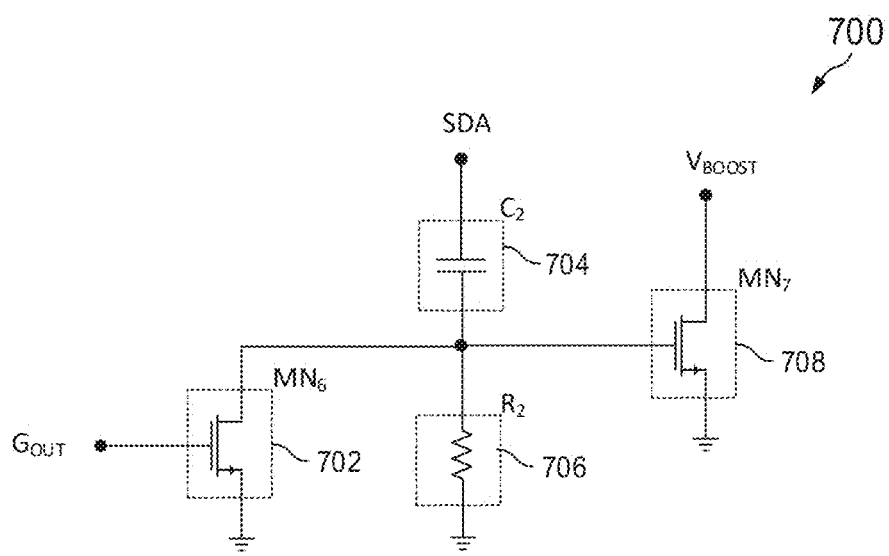
FIG. 7 is a schematic of an embodiment ESD protection circuit.

FIG. 7 illustrates a schematic of an embodiment ESD protection circuit 700, which may be implemented as the ESD protection circuit 108 or provided as a complementary circuit for further ESD protection within the ESD protection circuit 108. ESD protection circuit 700 includes a sixth n-channel transistor ($MN_6$) 702, a second capacitor ($C_2$) 704, a second resistor ($R_2$) 706, and a seventh n-channel transistor ($MN_7$) 708, which may (or may not) be arranged as shown.

The sixth n-channel transistor ($MN_6$) 702 is a low-voltage transistor (i.e., threshold voltage ($V_TH$) of between 0.4 and 0.6V inclusive (e.g., 0.5V) with a first gate oxide "Gate Oxide 1" (GO1) layer optimized for standard performance characteristics at a 1.8V supply voltage).

The seventh n-channel transistor ($MN_7$) 708 is a high-voltage transistor (i.e., it has a threshold voltage ($V_TH$) of between 0.8 and 1.2V inclusive (e.g., 1V) and a maximum rated operating voltage greater than 12V).

In the case of a positive surge on the SDA line, it is desirable to prevent it from transmitting to the low-voltage, second n-channel transistor ($MN_2$) 208. Specifically, there is a risk that the positive surge is transmitted to the drain terminal of the low-voltage, second n-channel transistor ($MN_2$) 208 through the third n-channel transistor ($MN_3$) 406.

Accordingly, ESD protection circuit 700 shunts the boosted supply voltage ($V_{BOOST}$) to the reference ground if a positive surge is detected on the SDA line through the second capacitor ($C_2$) 704 and the second resistor ($R_2$) 706.

The gate terminal of the sixth n-channel transistor ($MN_6$) 702 is coupled to the output of the buffer circuit 104. The source terminal of the sixth n-channel transistor ($MN_6$) 702 is coupled to the reference ground. The drain terminal of the sixth n-channel transistor ($MN_6$) 702 is coupled to the first terminal of the second capacitor ($C_2$) 704, the first terminal of the second resistor ($R_2$) 706, and the gate terminal of the seventh n-channel transistor ($MN_7$) 708.

The second terminal of the second capacitor ($C_2$) 704 is coupled to the SDA line. The second terminal of the second resistor ($R_2$) 706 is coupled to the reference ground.

The source terminal of the seventh n-channel transistor ($MN_7$) 708 is coupled to the reference ground. The drain terminal of the seventh n-channel transistor ($MN_7$) 708 is coupled to the boosted supply voltage ($V_{BOOST}$).

In the case of a positive surge on the SDA line, the second capacitor ($C_2$) 704 pulls up the voltage at the gate terminal of the seventh n-channel transistor ($MN_7$) 708, which turns ON the seventh n-channel transistor ($MN_7$) 708. By activating the seventh n-channel transistor ($MN_7$) 708, the boosted supply voltage ($V_{BOOST}$) is discharged and the third n-channel transistor ($MN_3$) 406 is turned OFF. By deactivating the third n-channel transistor ($MN_3$) 406, a surge voltage on the SDA line is prevented from being received at the drain terminal of the low-voltage, second n-channel transistor ($MN_2$) 208 and protecting it from ESD damage.

During an ESD event on the SDA line, which can occur during chip manipulations when the chip is not powered, the charge pump is not operational. However, this does not imply that the boosted supply voltage ($V_{BOOST}$) is forced to 0V. During this time, no circuitry actively prevents the boosted supply voltage ($V_{BOOST}$) from rising due to drain-gate capacitive coupling in the second n-channel transistor ($MN_2$) 208. Therefore, the boosted supply voltage ($V_{BOOST}$) is considered uncontrolled, as its voltage is left to vary based on parasitic capacitances.

The sixth n-channel transistor ($MN_6$) 702 prevents the seventh n-channel transistor ($MN_7$) 708 from accidentally discharging the boosted supply voltage ($V_{BOOST}$) when the charge pump 402 is active (i.e., when $G_{OUT}$ equals high logic level). The buffer circuit 104 is disabled, for example, when the I²C system is in receive mode.

The gate terminal of the sixth n-channel transistor ($MN_6$) 702 receives an enable signal ($G_{OUT}$) when the buffer circuit 104 is enabled. The enable signal ($G_{OUT}$) forces the sixth n-channel transistor ($MN_6$) 702 to be in the ON state in normal operation when the charge pump generating the boosted supply voltage ($V_{BOOST}$) is active, which forces the seventh n-channel transistor ($MN_7$) 708 in the OFF state. Otherwise, a steep rising edge on the SDA line can cause the seventh n-channel transistor ($MN_7$) 708 to inadvertently shunt the boosted supply voltage ($V_{BOOST}$), leading to chip malfunction.

A first aspect relates to a buffer circuit for a communication interface. The buffer circuit includes a charge pump configured to boost a supply voltage supplied to the buffer circuit and generate a boosted supply voltage at an output terminal of the charge pump; a first resistor; a first capacitor having a first terminal coupled to an output terminal of the buffer circuit; a first p-channel transistor having a source terminal coupled to the supply voltage, a drain terminal of the first p-channel transistor coupled to a first terminal of the first resistor, a gate terminal of the first p-channel transistor coupled to an input of the buffer circuit; a first n-channel transistor having a source terminal coupled to reference ground, a drain terminal of the first n-channel transistor coupled to a second terminal of the first resistor, a gate terminal of the first n-channel transistor coupled to the input of the buffer circuit; a second n-channel transistor having a source terminal coupled to reference ground, a gate terminal of the second n-channel transistor coupled to the second terminal of the first resistor; a third n-channel transistor having a source terminal coupled to the drain terminal of the second n-channel transistor, a drain terminal of the third n-channel transistor coupled to the output terminal of the buffer circuit, a gate terminal of the third n-channel transistor coupled to the output terminal of the charge pump and configured to receive the boosted supply voltage; a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and a fifth n-channel transistor having a gate terminal coupled to its drain terminal and the second terminal of the first resistor, the source terminal of the fifth n-channel transistor coupled to the second terminal of the first capacitor.

In a first implementation form of the buffer circuit, according to the first aspect as such, the buffer circuit further includes a filtering circuit coupled between the charge pump and the gate terminal of the third n-channel transistor. The filtering circuit configured to reduce ripples at the output terminal of the charge pump from the gate terminal of the third n-channel transistor; and reduce noise generated by switching of an SDA signal of the buffer circuit.

In a second implementation form of the buffer circuit, according to the first aspect as such or any preceding implementation form of the first aspect, the communication interface is an integrated circuit (I²C) communication interface. The buffer circuit is arranged on a serial data line of a communication bus of the I²C communication interface.

In a third implementation form of the buffer circuit, according to the first aspect as such or any preceding implementation form of the first aspect, the first p-channel transistor, the first n-channel transistor, the second n-channel transistor, the fourth n-channel transistor, and the fifth n-channel transistor are low-voltage transistors having a threshold voltage between 0.4 and 0.6V inclusive.

In a fourth implementation form of the buffer circuit, according to the first aspect as such or any preceding implementation form of the first aspect, the third n-channel transistor is a high-voltage transistor with a threshold voltage between 0.8 and 1V inclusive.

In a fifth implementation form of the buffer circuit, according to the first aspect as such or any preceding implementation form of the first aspect, the supply voltage is less than 1.4V, and wherein the boosted supply voltage is greater than 2.5V.

In a sixth implementation form of the buffer circuit, according to the first aspect as such or any preceding implementation form of the first aspect, the supply voltage is 1.2V. The first p-channel transistor, the first n-channel transistor, the second n-channel transistor, the fourth n-channel transistor, and the fifth n-channel transistor are low-voltage transistors having a threshold voltage between 0.4 and 0.6V inclusive. The third n-channel transistor is a high-voltage transistor with a threshold voltage between 0.8 and 1V inclusive.

A second aspect related to a buffer circuit for a communication interface. The buffer circuit comprising a charge pump configured to boost a supply voltage supplied to the buffer circuit and generate a boosted supply voltage at an output terminal of the charge pump; a reference current source configured to generate a reference current; a mirror p-channel transistor having a gate terminal coupled to the reference current source; a reference p-channel transistor having a source terminal coupled to the supply voltage, a gate terminal of the reference p-channel transistor coupled to its drain terminal and the reference current source; a first capacitor having a first terminal coupled to an output terminal of the buffer circuit; a first p-channel transistor having a source terminal coupled to the supply voltage, a drain terminal of the first p-channel transistor coupled to a source terminal of the mirror p-channel transistor, a gate terminal of the first p-channel transistor coupled to an input of the buffer circuit; a first n-channel transistor having a source terminal coupled to reference ground, a drain terminal of the first n-channel transistor coupled to a drain terminal of the mirror p-channel transistor, a gate terminal of the first n-channel transistor coupled to the input of the buffer circuit; a second n-channel transistor having a source terminal coupled to reference ground, a gate terminal of the second n-channel transistor coupled to the drain terminal of the mirror p-channel transistor; a third n-channel transistor having a source terminal coupled to the drain terminal of the second n-channel transistor, a drain terminal of the third n-channel transistor coupled to the output terminal of the buffer circuit, a gate terminal of the third n-channel transistor coupled to the output terminal of the charge pump and configured to receive the boosted supply voltage; a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and a fifth n-channel transistor having a gate terminal coupled to its drain terminal and the drain terminal of the mirror p-channel transistor, the source terminal of the fifth n-channel transistor coupled to the second terminal of the first capacitor.

In a first implementation form of the buffer circuit, according to the second aspect as such, the buffer circuit further includes a filtering circuit coupled between the charge pump and the gate terminal of the third n-channel transistor. The filtering circuit is configured to reduce ripples at the output terminal of the charge pump from the gate terminal of the third n-channel transistor.

In a second implementation form of the buffer circuit, according to the second aspect as such or any preceding implementation form of the second aspect, the communication interface is an integrated circuit ($I^2C$) communication interface. The buffer circuit is arranged on a serial data line of a communication bus of the $I^2C$ communication interface.

In a third implementation form of the buffer circuit, according to the second aspect as such or any preceding implementation form of the second aspect, the mirror p-channel transistor, the reference p-channel transistor, the first p-channel transistor, the first n-channel transistor, the second n-channel transistor, the fourth n-channel transistor, and the fifth n-channel transistor are low-voltage transistors having a threshold voltage between 0.4 and 0.6V inclusive.

In a fourth implementation form of the buffer circuit, according to the second aspect as such or any preceding implementation form of the second aspect, the third n-channel transistor is a high-voltage transistor with a threshold voltage between 0.8 and 1V inclusive.

In a fifth implementation form of the buffer circuit, according to the second aspect as such or any preceding implementation form of the second aspect, the supply voltage is less than 1.4V, and wherein the boosted supply voltage is greater than 2.5V.

In a sixth implementation form of the buffer circuit, according to the second aspect as such or any preceding implementation form of the second aspect, the supply voltage is 1.2V. The mirror p-channel transistor, the reference p-channel transistor, the first p-channel transistor, the first n-channel transistor, the second n-channel transistor, the fourth n-channel transistor, and the fifth n-channel transistor are low-voltage transistors having a threshold voltage between 0.4 and 0.6V inclusive. The third n-channel transistor is a high-voltage transistor with a threshold voltage between 0.8 and 1V inclusive.

A third aspect relates to a communication system. The communication system comprising: a primary controller comprising a first buffer circuit; an auxiliary circuit coupled to the primary controller through a communication bus, the auxiliary circuit comprising a second buffer circuit; wherein the first buffer circuit or the second buffer circuit comprises a charge pump configured to boost a supply voltage supplied to the associated buffer circuit and generate a boosted supply voltage at an output terminal of the charge pump; a first resistor; a first capacitor having a first terminal coupled to an output terminal of the associated buffer circuit; a first p-channel transistor having a source terminal coupled to the supply voltage, a drain terminal of the first p-channel transistor coupled to a first terminal of the first resistor, a gate terminal of the first p-channel transistor coupled to an input of the associated buffer circuit; a first n-channel transistor having a source terminal coupled to reference ground, a drain terminal of the first n-channel transistor coupled to a second terminal of the first resistor, a gate terminal of the first n-channel transistor coupled to the input of the associated buffer circuit; a second n-channel transistor having a source terminal coupled to reference ground, a gate terminal of the second n-channel transistor coupled to the second terminal of the first resistor; a third n-channel transistor having a source terminal coupled to the drain terminal of the second n-channel transistor, a drain terminal of the third n-channel transistor coupled to the output terminal of the associated buffer circuit, a gate terminal of the third n-channel transistor coupled to the output terminal of the charge pump and configured to receive the boosted supply voltage; a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and a fifth n-channel transistor having a gate terminal coupled to its drain terminal and the second terminal of the first resistor, the source terminal of the fifth n-channel transistor coupled to the second terminal of the first capacitor.

In a first implementation form of the communication system according to the third aspect as such, the first buffer circuit or the second buffer circuit further comprises a filtering circuit coupled between the charge pump and the gate terminal of the third n-channel transistor, the filtering circuit configured to reduce ripples at the output terminal of the charge pump from the gate terminal of the third n-channel transistor; and reduce noise generated by switching of an SDA signal In a second implementation form of the communication system, according to the third aspect as such or any preceding implementation form of the third aspect, each of the primary controller and the auxiliary controller further comprises an electrostatic discharge (ESD) protection circuit configured to provide ESD protection, the ESD protection circuit comprising a second capacitor having a first terminal coupled to the communication bus; a second resistor having a first terminal coupled to a second terminal of the second capacitor, a second terminal of the second resistor coupled to reference ground; a sixth n-channel transistor having a gate terminal configured to receive a signal corresponding to an operational state of the associated buffer circuit, a source terminal of the sixth n-channel transistor coupled to reference ground; and a seventh n-channel transistor having a gate terminal coupled to a drain terminal of the sixth n-channel transistor, the second terminal of the second capacitor, and the first terminal of the second resistor, a source terminal of the seventh n-channel transistor coupled to reference ground, and a drain terminal of the seventh n-channel transistor coupled to the output terminal of the charge pump and configured to receive the boosted supply voltage.

In a third implementation form of the communication system, according to the third aspect as such or any preceding implementation form of the third aspect, the communication system is a communication system with an integrated circuit ($I^2C$) communication interface. Each buffer circuit is arranged on a serial data line of the communication bus.

In a fourth implementation form of the communication system, according to the third aspect as such or any preceding implementation form of the third aspect, the first p-channel transistor, the first n-channel transistor, the second n-channel transistor, the fourth n-channel transistor, and the fifth n-channel transistor are low-voltage transistors having a threshold voltage between 0.4 and 0.6V inclusive, and wherein the third n-channel transistor is a high-voltage transistor with a threshold voltage between 0.8 and 1V inclusive.

In a fifth implementation form of the communication system, according to the third aspect as such or any preceding implementation form of the third aspect, the supply voltage is less than 1.4V, and wherein the boosted supply voltage is greater than 2.5V.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A buffer circuit for a communication interface, the buffer circuit comprising:

a charge pump configured to boost a supply voltage supplied to the buffer circuit and generate a boosted supply voltage at an output terminal of the charge pump;

a first resistor;

a first capacitor having a first terminal coupled to an output terminal of the buffer circuit;

a first p-channel transistor having a source terminal coupled to the supply voltage, a drain terminal of the first p-channel transistor coupled to a first terminal of the first resistor, a gate terminal of the first p-channel transistor coupled to an input of the buffer circuit;

a first n-channel transistor having a source terminal coupled to reference ground, a drain terminal of the first n-channel transistor coupled to a second terminal of the first resistor, a gate terminal of the first n-channel transistor coupled to the input of the buffer circuit;

a second n-channel transistor having a source terminal coupled to reference ground, a gate terminal of the second n-channel transistor coupled to the second terminal of the first resistor;

a third n-channel transistor having a source terminal coupled to the drain terminal of the second n-channel transistor, a drain terminal of the third n-channel transistor coupled to the output terminal of the buffer circuit, a gate terminal of the third n-channel transistor coupled to the output terminal of the charge pump and configured to receive the boosted supply voltage;

a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and a fifth n-channel transistor having a gate terminal coupled to its drain terminal and the second terminal of the first resistor, the source terminal of the fifth n-channel transistor coupled to the second terminal of the first capacitor.

2. The buffer circuit of claim 1, further comprising a filtering circuit coupled between the charge pump and the gate terminal of the third n-channel transistor, the filtering circuit configured to:

reduce ripples at the output terminal of the charge pump from the gate terminal of the third n-channel transistor; and reduce noise generated by switching of an SDA signal of the buffer circuit.

3. The buffer circuit of claim 1, wherein the communication interface is an integrated circuit ($I^2C$) communication interface, and wherein the buffer circuit is arranged on a serial data line of a communication bus of the $I^2C$ communication interface.

4. The buffer circuit of claim 1, wherein the first p-channel transistor, the first n-channel transistor, the second n-channel transistor, the fourth n-channel transistor, and the fifth n-channel transistor are low-voltage transistors having a threshold voltage between 0.4 and 0.6V inclusive.

5. The buffer circuit of claim 1, wherein the third n-channel transistor is a high-voltage transistor with a threshold voltage between 0.8 and 1V inclusive.

6. The buffer circuit of claim 1, wherein the supply voltage is less than 1.4V, and wherein the boosted supply voltage is greater than 2.5V.

7. The buffer circuit of claim 1, wherein the supply voltage is 1.2V, wherein the first p-channel transistor, the first n-channel transistor, the second n-channel transistor, the

19 fourth n-channel transistor, and the fifth n-channel transistor are low-voltage transistors having a threshold voltage between 0.4 and 0.6V inclusive, and wherein the third n-channel transistor is a high-voltage transistor with a threshold voltage between 0.8 and 1V inclusive.

8. A buffer circuit for a communication interface, the buffer circuit comprising:
- a charge pump configured to boost a supply voltage supplied to the buffer circuit and generate a boosted supply voltage at an output terminal of the charge pump;
- a reference current source configured to generate a reference current;
- a mirror p-channel transistor having a gate terminal coupled to the reference current source;
- a reference p-channel transistor having a source terminal coupled to the supply voltage, a gate terminal of the reference p-channel transistor coupled to its drain terminal and the reference current source;
- a first capacitor having a first terminal coupled to an output terminal of the buffer circuit;
- a first p-channel transistor having a source terminal coupled to the supply voltage, a drain terminal of the first p-channel transistor coupled to a source terminal of the mirror p-channel transistor, a gate terminal of the first p-channel transistor coupled to an input of the buffer circuit;
- a first n-channel transistor having a source terminal coupled to reference ground, a drain terminal of the first n-channel transistor coupled to a drain terminal of the mirror p-channel transistor, a gate terminal of the first n-channel transistor coupled to the input of the buffer circuit;
- a second n-channel transistor having a source terminal coupled to reference ground, a gate terminal of the second n-channel transistor coupled to the drain terminal of the mirror p-channel transistor;
- a third n-channel transistor having a source terminal coupled to the drain terminal of the second n-channel transistor, a drain terminal of the third n-channel transistor coupled to the output terminal of the buffer circuit, a gate terminal of the third n-channel transistor coupled to the output terminal of the charge pump and configured to receive the boosted supply voltage;
- a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and
- a fifth n-channel transistor having a gate terminal coupled to its drain terminal and the drain terminal of the mirror p-channel transistor, the source terminal of the fifth n-channel transistor coupled to the second terminal of the first capacitor.

9. The buffer circuit of claim 8, further comprising a filtering circuit coupled between the charge pump and the gate terminal of the third n-channel transistor, the filtering circuit configured to reduce ripples at the output terminal of the charge pump from the gate terminal of the third n-channel transistor.

10. The buffer circuit of claim 8, wherein the communication interface is an integrated circuit (I²C) communication interface, and wherein the buffer circuit is arranged on a serial data line of a communication bus of the I²C communication interface.

20

11. The buffer circuit of claim 8, wherein the mirror p-channel transistor, the reference p-channel transistor, the first p-channel transistor, the first n-channel transistor, the second n-channel transistor, the fourth n-channel transistor, and the fifth n-channel transistor are low-voltage transistors having a threshold voltage between 0.4 and 0.6V inclusive.

12. The buffer circuit of claim 8, wherein the third n-channel transistor is a high-voltage transistor with a threshold voltage between 0.8 and 1V inclusive.

13. The buffer circuit of claim 8, wherein the supply voltage is less than 1.4V, and wherein the boosted supply voltage is greater than 2.5V.

14. The buffer circuit of claim 8, wherein the supply voltage is 1.2V, wherein the mirror p-channel transistor, the reference p-channel transistor, the first p-channel transistor, the first n-channel transistor, the second n-channel transistor, the fourth n-channel transistor, and the fifth n-channel transistor are low-voltage transistors having a threshold voltage between 0.4 and 0.6V inclusive, and wherein the third n-channel transistor is a high-voltage transistor with a threshold voltage between 0.8 and 1V inclusive.

15. A communication system, comprising:
- a primary controller comprising a first buffer circuit;
- an auxiliary circuit coupled to the primary controller through a communication bus, the auxiliary circuit comprising a second buffer circuit;
- wherein the first buffer circuit or the second buffer circuit comprises:
  - a charge pump configured to boost a supply voltage supplied to the associated buffer circuit and generate a boosted supply voltage at an output terminal of the charge pump;
  - a first resistor;
  - a first capacitor having a first terminal coupled to an output terminal of the associated buffer circuit;
  - a first p-channel transistor having a source terminal coupled to the supply voltage, a drain terminal of the first p-channel transistor coupled to a first terminal of the first resistor, a gate terminal of the first p-channel transistor coupled to an input of the associated buffer circuit;
  - a first n-channel transistor having a source terminal coupled to reference ground, a drain terminal of the first n-channel transistor coupled to a second terminal of the first resistor, a gate terminal of the first n-channel transistor coupled to the input of the associated buffer circuit;
  - a second n-channel transistor having a source terminal coupled to reference ground, a gate terminal of the second n-channel transistor coupled to the second terminal of the first resistor;
  - a third n-channel transistor having a source terminal coupled to the drain terminal of the second n-channel transistor, a drain terminal of the third n-channel transistor coupled to the output terminal of the associated buffer circuit, a gate terminal of the third n-channel transistor coupled to the output terminal of the charge pump and configured to receive the boosted supply voltage;
  - a fourth n-channel transistor having a source terminal coupled to reference ground, a drain terminal of the fourth n-channel transistor coupled to a second terminal of the first capacitor, a gate terminal of the fourth n-channel transistor coupled to the gate terminal of the first n-channel transistor; and
  - a fifth n-channel transistor having a gate terminal coupled to its drain terminal and the second terminal of the first resistor, the source terminal of the fifth n-channel transistor coupled to the second terminal of the first capacitor.

16. The communication system of claim 15, wherein the first buffer circuit or the second buffer circuit further comprises a filtering circuit coupled between the charge pump and the gate terminal of the third n-channel transistor, the filtering circuit configured to:
   reduce ripples at the output terminal of the charge pump from the gate terminal of the third n-channel transistor; and
   reduce noise generated by switching of an SDA signal.

17. The communication system of claim 15, wherein each of the primary controller and the auxiliary circuit further comprises an electrostatic discharge (ESD) protection circuit configured to provide ESD protection, the ESD protection circuit comprising:
   a second capacitor having a first terminal coupled to the communication bus;
   a second resistor having a first terminal coupled to a second terminal of the second capacitor, a second terminal of the second resistor coupled to reference ground;
   a sixth n-channel transistor having a gate terminal configured to receive a signal corresponding to an operational state of the associated buffer circuit, a source terminal of the sixth n-channel transistor coupled to reference ground; and
   a seventh n-channel transistor having a gate terminal coupled to a drain terminal of the sixth n-channel transistor, the second terminal of the second capacitor, and the first terminal of the second resistor, a source terminal of the seventh n-channel transistor coupled to reference ground, and a drain terminal of the seventh n-channel transistor coupled to the output terminal of the charge pump and configured to receive the boosted supply voltage.

18. The communication system of claim 15, wherein the communication system is a communication system with an integrated circuit ($I^2C$) communication interface, and wherein each buffer circuit is arranged on a serial data line of the communication bus.

19. The communication system of claim 15, wherein the first p-channel transistor, the first n-channel transistor, the second n-channel transistor, the fourth n-channel transistor, and the fifth n-channel transistor are low-voltage transistors having a threshold voltage between 0.4 and 0.6V inclusive, and wherein the third n-channel transistor is a high-voltage transistor with a threshold voltage between 0.8 and 1V inclusive.

20. The communication system of claim 15, wherein the supply voltage is less than 1.4V, and wherein the boosted supply voltage is greater than 2.5V.

* * * * *